United States Patent
Jeong et al.

(10) Patent No.: US 10,361,692 B2
(45) Date of Patent: Jul. 23, 2019

(54) DUTY CYCLE DETECTOR AND PHASE DIFFERENCE DETECTOR

(71) Applicants: SK hynix Inc., Icheon (KR); Seoul National University R&DB Foundation, Seoul (KR)

(72) Inventors: Deog-Kyoon Jeong, Seoul (KR); Suhwan Kim, Seoul (KR); Joo-Hyung Chae, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/149,687

(22) Filed: Oct. 2, 2018

(65) Prior Publication Data
US 2019/0131962 A1    May 2, 2019

(30) Foreign Application Priority Data

Oct. 26, 2017  (KR) ........................ 10-2017-0140210

(51) Int. Cl.
| | |
|---|---|
| H03K 5/26 | (2006.01) |
| H03K 3/03 | (2006.01) |
| G01R 25/00 | (2006.01) |
| H03H 7/06 | (2006.01) |
| H03K 17/687 | (2006.01) |

(52) U.S. Cl.
CPC ............... H03K 5/26 (2013.01); G01R 25/00 (2013.01); H03H 7/06 (2013.01); H03K 3/0315 (2013.01); H03K 17/687 (2013.01)

(58) Field of Classification Search
None
See application file for complete search history.

(56) References Cited

U.S. PATENT DOCUMENTS

| 7,403,055 B2 | 7/2008 | Minzoni | |
| 9,973,195 B2* | 5/2018 | Grollitsch | ............... H03L 7/087 |

FOREIGN PATENT DOCUMENTS

KR    10-1727653 B1    4/2017

* cited by examiner

*Primary Examiner* — Jeffery S Zweizig (57) ABSTRACT

A duty cycle detector includes a first ring oscillator suitable for including an odd number of first inverters and generating a first periodic signal by using the first inverters, at least one inverter among the first inverters being enabled during a time interval when a clock has a first value, a second ring oscillator including an odd number of second inverters and suitable for generating a second periodic signal using the second inverters, at least one inverter among the second inverters being enabled during a time interval when the clock has a second value. The duty cycle detector further includes a frequency comparator suitable for comparing a frequency of the first periodic signal with a frequency of the second periodic signal and generating a duty cycle detection signal of the clock.

17 Claims, 6 Drawing Sheets

DUTY CYCLE DETECTOR AND PHASE DIFFERENCE DETECTOR

CROSS-REFERENCE TO RELATED APPLICATION

The present application claims priority to Korean Patent Application No. 10-2017-0140210, filed on Oct. 26, 2017, which is incorporated herein by reference in its entirety.

BACKGROUND

1. Field

Illustrative embodiments of the present disclosure relate to a duty cycle detector for detecting a duty cycle of a clock, and a phase difference detector for detecting a phase difference between clocks.

2. Description of the Related Art

As the data transfer rates of diverse integrated circuits, such as a memory, are increased, using a clock of a high frequency to transfer data between integrated circuits becomes increasingly burdensome. In this respect, multi-phase clocks of lower frequencies than the frequency of the clock used for data transfer between integrated circuits may be used in an integrated circuit chip.

Figure 1:
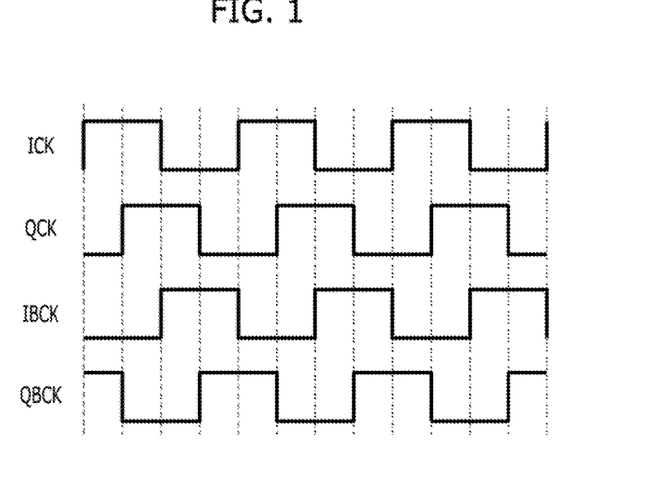
FIG. 1 illustrates an example of multi-phase clocks.

FIG. 1 illustrates an example of multi-phase clocks. Referring to FIG. 1, four clocks ICK, QCK, IBCK, and QBCK may have a phase difference of approximately 90 degrees (°). Rising edges of the clock ICK and the clock QCK may have a phase difference of approximately 90°, and rising edges of the clock QCK and the clock IBCK may have a phase difference of approximately 90°. Also, the rising edges of the clock IBCK and the clock QBCK may have a phase difference of approximately 90°. Also, all the four clocks ICK, QCK, IBCK, and QBCK may have a duty cycle ratio of approximately 50%. In short, all the four clocks ICK, QCK, IBCK, and QBCK may have a high pulse width that is substantially the same as a low pulse width.

FIG. 1 illustrates an ideal phase difference and an ideal duty cycle ratio of the multi-phase clocks ICK, QCK, IBCK, and QBCK. When the multi-phase clocks ICK, QCK, IBCK, and QBCK are used in an actual integrated circuit, the phase difference among the clocks ICK, QCK, IBCK, and QBCK may not be maintained at approximately 90° and the duty cycle ratio of the clocks ICK, QCK, IBCK, and QBCK may not be maintained at approximately 50% due to various noise in the integrated circuit.

In order to maintain the duty cycle ratio of the clocks ICK, QCK, IBCK, and QBCK at approximately 50% and maintain the phase difference among the clocks ICK, QCK, IBCK, and QBCK at approximately 90°, it is desirable to develop a technology for accurately detecting a duty of a clock and a technology for accurately detecting the phase difference between clocks.

SUMMARY

Embodiments of the present disclosure are directed to a technology for accurately detecting a duty cycle ratio of a clock and a technology for accurately detecting a phase difference between clocks.

In accordance with an embodiment of the present disclosure, a duty cycle detector includes: a first ring oscillator including an odd number of first inverters and suitable for generating a first periodic signal using the first inverters, wherein at least one inverter among the first inverters is enabled during a time interval when a clock has a first value; a second ring oscillator including an odd number of second inverters and suitable for generating a second periodic signal using the second inverters, wherein at least one inverter among the second inverters is enabled during a time interval when the clock has a second value; and a frequency comparator suitable for comparing a frequency of the first periodic signal with a frequency of the second periodic signal and generating a duty cycle detection signal of the clock.

In accordance with another embodiment of the present disclosure, a duty cycle detector includes: a ring oscillator suitable for including an odd number of inverters and suitable for generating a periodic signal using the inverters, wherein at least one inverter among the inverters is enabled during a first time interval when a clock has a first value in a first mode and enabled during a second time interval when the clock has a second value in a second mode; and a frequency comparator suitable for comparing a frequency of the periodic signal generated in the first mode with a frequency of the periodic signal generated in the second mode and generating a duty cycle detection signal of the clock.

In accordance with yet another embodiment of the present disclosure, a phase difference detector includes: a first ring oscillator suitable for including an odd number of first inverters, and suitable for generating a first periodic signal using the first inverters, wherein at least one first inverter among the first inverters is enabled in during a first time interval when a first clock and a second clock have different logic values; a second ring oscillator suitable for including an odd number of second inverters and suitable for generating a second periodic signal using the second inverters, wherein at least one inverter among the second inverters is enabled during a second time interval when the first clock and the second have a common logic value; and a frequency comparator suitable for comparing a frequency of the first periodic signal with a frequency of the second periodic signal and generating a phase difference detection signal indicative of a phase difference between the first clock and the second clock.

In accordance with still another embodiment of the present disclosure, a phase difference detector includes: a ring oscillator suitable for including an odd number of inverters and generating a periodic signal by using the inverters, wherein at least one inverter among the inverters is enabled during a first time interval when a first clock and a second clock have different logic values in a first mode and enabled in a second time interval when the first clock and the second clock have a common logic value in a second mode; and a frequency comparator suitable for comparing a frequency of the periodic signal generated in the first mode with a frequency of the periodic signal generated in the second mode and generating a phase difference detection signal between the first clock and the second clock.

DETAILED DESCRIPTION

Illustrative embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

Figure 2:
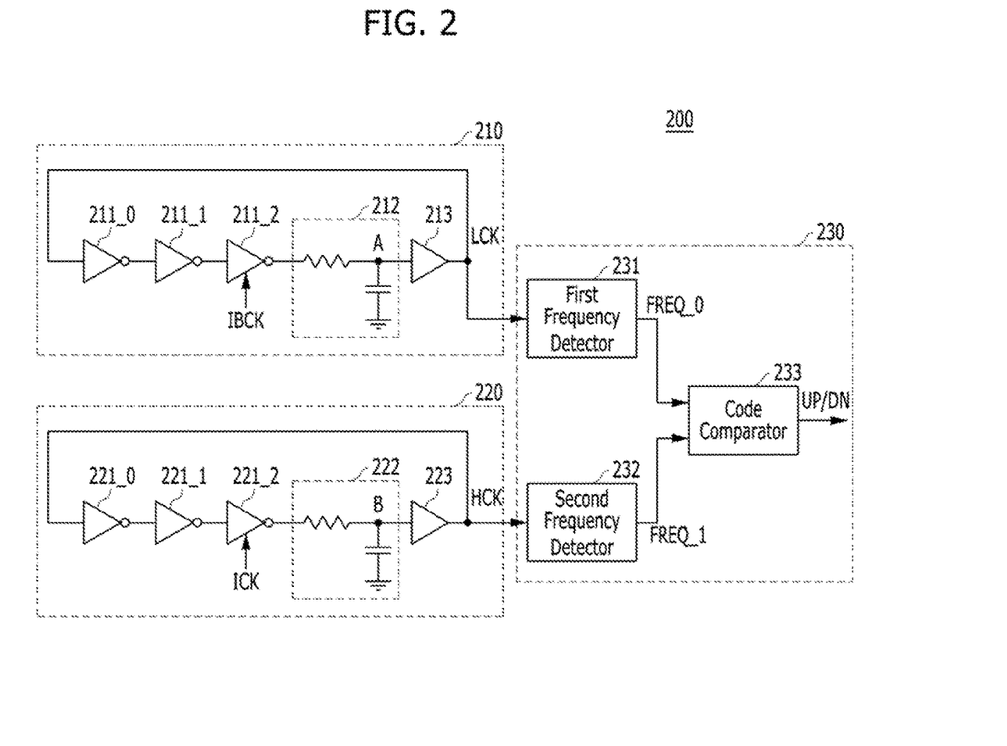
FIG. 2 is a block diagram illustrating a duty cycle detector 200 in accordance with an embodiment of the present disclosure.

FIG. 2 is a block diagram illustrating a duty cycle detector 200 in accordance with an embodiment of the present disclosure. Referring to FIG. 2, the duty cycle detector 200 may include a first ring oscillator 210, a second ring oscillator 220, and a frequency comparator 230.

The first ring oscillator 210 may generate a first periodic wave (or a first periodic signal) LCK having a frequency which is in proportion to a low pulse width of a clock ICK, which is equal to a high pulse width of an inverted clock IBCK. The first ring oscillator 210 may include an odd number 2N−1 of first inverters, for example, three first inverters 211_0 to 211_2 (where N is an integer equal to or greater than '1'), a first low-pass filter (LPF) 212, and a first Schmitt trigger circuit 213.

The first inverters 211_0 to 211_2 may be coupled in a ring to be used for generation of the first periodic wave LCK. An inverter 211_2 among the first inverters 211_0 to 211_2 may be enabled in a section (that is, a time interval) where the clock ICK has a first value (e.g., a logic low level) and disabled when the clock ICK has a second value (e.g., a logic high level). Equivalently, the inverter 211_2 may be enabled in a section where the inverted clock IBCK has the second value and disabled when the inverted clock IBCK has the first value. Since the inverter 211_2 is enabled in the section where the clock ICK is in a logic low level and disabled otherwise, the length (or a duration) of the section (that is, a time interval) where the clock ICK is in a logic low level may affect the frequency of the first periodic wave LCK which is generated by the first ring oscillator 210. Herein, although FIG. 2 shows an example where the inverter 211_2 among the first inverters 211_0 to 211_2 is enabled in the section where the clock ICK is in a logic low level, embodiments of the present disclosure are not limited thereto. In an embodiment, one or more of the other first inverters 211_0 and 211_1 may be designed to be enabled in the section where the clock ICK has a logic low level and disabled otherwise.

A first end (e.g., a front end) of the first low-pass filter 212 may be coupled to an output terminal of the inverter 211_2. A node A at a second end (e.g., a rear end) of the first low-pass filter 212 may have a voltage that is gradually changed due to a filtering operation of the first low-pass filter 212. The first low-pass filter 212 may include a resistor and a capacitor.

The first Schmitt trigger circuit 213 may be coupled to the node A at the rear end of the first low-pass filter 212. The first Schmitt trigger circuit 213 transitions its output signal into a logic high level when the voltage of the node A is higher than a first given value, which may be equal to a reference value plus an offset value α (i.e., the reference value+the offset value α). The first Schmitt trigger circuit 213 transitions its output signal into a logic low level when the voltage of the node A is lower than a second given value, which may be equal to the reference value minus the offset value α (i.e., the reference value−the offset value α). In an embodiment, the first and second given values are predetermine values. Herein, the reference value may be a reference value for determining logic levels of signals output from general devices, such as the first inverters 211_0 to 211_2, between a logic high level and a logic low level.

The first low-pass filter 212 and the first Schmitt trigger circuit 213 are used to accumulate the influence of the length of a section where the clock ICK is in a logic low level on the frequency of the first periodic wave LCK. In another embodiment, the first low-pass filter 212 and the first Schmitt trigger circuit 213 may be omitted from the first ring oscillator 210.

The second ring oscillator 220 may generate a second periodic wave (or a second periodic signal) HCK having a frequency which is in proportion to a high pulse width of the clock ICK. The second ring oscillator 220 may include an odd number 2N−1 of second inverters, for example, three second inverters 221_0 to 221_2 (where N is an integer equal to or greater than '1'), a second low-pass filter 222, and a second Schmitt trigger circuit 223.

The second inverters 221_0 to 221_2 may be coupled in a ring to be used for generation of the second periodic wave HCK. An inverter 221_2 among the second inverters 221_0 to 221_2 may be enabled in a section where the clock ICK is in a logic high level and disabled in a section where the clock ICK is in a logic low level. Since the inverter 221_2 is enabled in the section where the clock ICK is in a logic high level, the length of the section where the clock ICK is in a logic high level may affect the frequency of the second periodic wave HCK which is generated in the second ring oscillator 220. Herein, although FIG. 2 shows an example where the inverter 221_2 among the second inverters 221_0 to 221_2 is enabled in the section where the clock ICK is in a logic high level, embodiments of the present disclosure are not limited thereto. In an embodiment, the other second inverters 221_0 and 221_1 may be designed to be enabled in the section where the clock ICK is in a logic high level and disabled otherwise.

A first end (e.g., a front end) of the second low-pass filter 222 may be coupled to an output terminal of the inverter 221_2. A node B at a second end (e.g., a rear end) of the second low-pass filter 222 may be gradually changed due to a filtering operation of the second low-pass filter 222. The second low-pass filter 222 may include a resistor and a capacitor.

The second Schmitt trigger circuit 223 may be coupled to the node B at the rear end of the second low-pass filter 222. The second Schmitt trigger circuit 223 transitions its output signal into a logic high level when the voltage at the node B is higher than a first given value, which is equal to a reference value plus an offset value α (i.e., the reference value+the offset value α). The second Schmitt trigger circuit 223 transitions its output signal into a logic low level when the voltage at the node B is lower than a second given value, which is equal to the reference value minus the offset value α (i.e., the reference value−the offset value α). Herein, the reference value may be a reference value for determining logic levels of signals output from general devices, such as the second inverters 221_0 to 221_2, between a logic high level and a logic low level.

When the first low-pass filter 212 and the first Schmitt trigger circuit 213 are omitted from the first ring oscillator 210, the second low-pass filter 222 and the second Schmitt trigger circuit 223 may be omitted from the second ring oscillator 220.

The frequency comparator 230 may compare the frequency of the first periodic wave LCK generated by the first ring oscillator 210 with the frequency of the second periodic wave HCK generated by the second ring oscillator 220 and generate a duty cycle detection signal UP/DN indicating a duty cycle ratio of the clock ICK. When the frequency of the first periodic wave LCK is higher than the frequency of the second periodic wave HCK, that is, when a low pulse width (or an off-time duration) of the clock ICK is longer than a high pulse width (or an on-time duration) of the clock ICK, the frequency comparator 230 may produce the duty cycle detection signal UP/DN of a first value (e.g., a logic high level). Also, when the frequency of the first periodic wave LCK is lower than the frequency of the second periodic wave HCK, that is, when a high pulse width of the clock ICK is longer than a low pulse width of the clock ICK, the frequency comparator 230 may produce the duty cycle detection result UP/DN of a second value (e.g., a logic low level).

The frequency comparator 230 may include a first frequency detector 231, a second frequency detector 232, and a code comparator 233. The first frequency detector 231 may detect the frequency of the first periodic wave LCK and generate a first frequency code FREQ_0 which represents the detected frequency of the first periodic wave LCK. The second frequency detector 232 may detect the frequency of the second periodic wave HCK and generate a second frequency code FREQ_1 which represents the detected frequency of the second periodic wave HCK. In an embodiment, the first frequency code FREQ_0 may have a value that is proportional to the detected frequency of the first periodic wave LCK, and the second frequency code FREQ_1 may have a value that is proportional to the detected frequency of the second periodic wave HCK. The code comparator 233 may compare the first frequency code FREQ_0 and the second frequency code FREQ_1 with each other and generate the duty cycle detection signal UP/DN. In an embodiment, the duty cycle detection signal UP/DN may have a logic high value when the value of the first frequency code FREQ_0 is greater than the value of the second frequency code FREQ_1. The duty cycle detection signal UP/DN may be transferred to a duty cycle correction circuit (not shown) of diverse forms and used to correct the duty cycle of the clock ICK.

Figure 3:
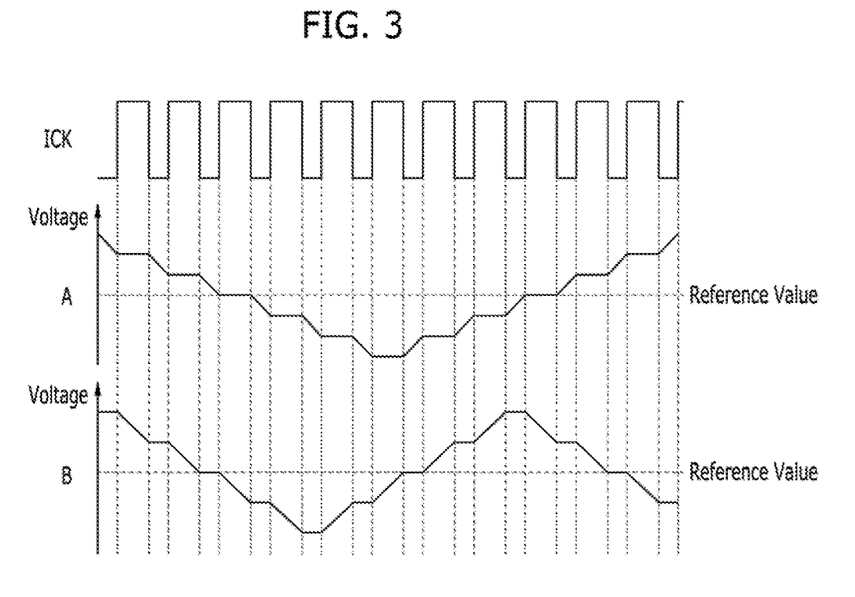
FIG. 3 illustrates an operation of a first ring oscillator 210 and an operation of a second ring oscillator 220 shown in FIG. 2, in accordance with an embodiment.

FIG. 3 illustrates an operation of the first ring oscillator 210 and an operation of the second ring oscillator 220 shown in FIG. 2, in accordance with an embodiment.

Referring to FIG. 3, the ratio of the high pulse width and the low pulse width of the clock ICK is approximately 6:4.

The inverter 211_2 among the first inverters 211-0 to 211-2 of the first ring oscillator 210 may be enabled during a section where the clock ICK is in a logic low level, that is, during an off-time duration of the clock ICK, and change the voltage at the node A. Since the inverter 211_2 of the first ring oscillator 210 may be disabled during a section where the clock ICK is in a logic high level, that is, during an on-time duration of the clock ICK, the voltage at the node A may not be changed during a section where the clock ICK is in a logic high level.

The inverter 221_2 among the second inverters 221_0 to 221_2 of the second ring oscillator 220 may be enabled during a section where the clock ICK is in a logic high level, that is, during the on-time duration of the clock ICK, and change the voltage at the node B. Since the inverter 221_2 of the second ring oscillator 220 may be disabled during a section where the clock ICK is in a logic low level, that is, during the off-time duration of the clock ICK, the voltage at the node B may not be changed during a section where the clock ICK is in a logic low level.

In other words, the voltage at the node A is changed during the off-time duration of the clock ICK and maintained during the on-time duration of the clock ICK, while the voltage at the node B is changed during the on-time duration of the clock ICK and maintained during the off-time duration of the clock ICK. In the embodiment shown in FIG. 3, the ratio of the on-time duration to the off-time duration of the clock ICK is substantially equal to 6:4. After all, a total time taken for the voltage at the node A to transition from a logic high level into a logic low level and then transition again from the logic low level into the logic high level may be longer than a total time taken for the voltage at the node B to transition from a logic high level into a logic low level and then transition again from the logic low level into the logic high level. In short, a first cycle (or a first period) of the first periodic wave LCK corresponding to the voltage at the node A may be longer than a first cycle of the second periodic wave HCK corresponding to the voltage at the node B. In other words, the frequency of the first periodic wave LCK corresponding to the voltage of the node A may be lower than the frequency of the second periodic wave HCK corresponding to the voltage at the node B.

Referring to FIG. 3, it may be seen that when the high pulse width of the clock ICK is longer than the low pulse width of the clock ICK, the frequency of the first periodic wave LCK is lower than the frequency of the second periodic wave HCK. In another example, when the low pulse width of the clock ICK is longer than the high pulse width of the clock ICK, the frequency of the first periodic wave LCK is higher than the frequency of the second periodic wave HCK.

Figure 4:
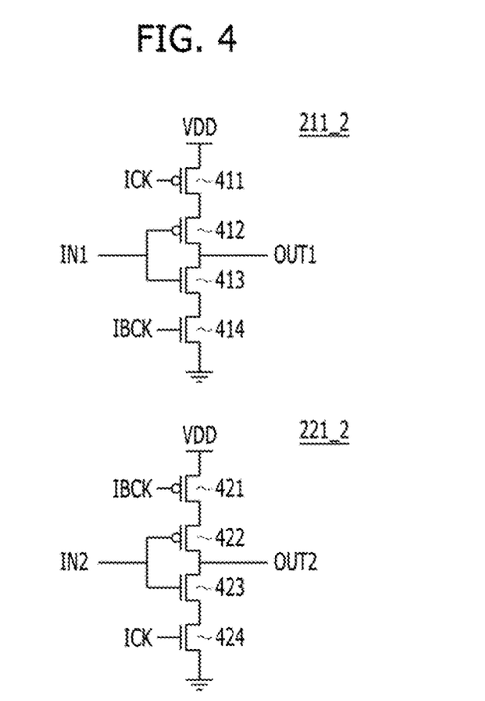
FIG. 4 is a schematic diagram illustrating a first inverter 211_2 and a second inverter 221_2 shown in FIG. 2, in accordance with an embodiment.

FIG. 4 is a schematic diagram illustrating the inverter (or a first inverter) 211_2 and the inverter (or a second inverter) 221_2 shown in FIG. 2.

The first inverter 211_2 may include first and second PMOS transistors 411 and 412 that are serially coupled between a power source voltage terminal (or a power supply voltage) VDD and an output node OUT1 of the first inverter 211_2, and first and second NMOS transistors 413 and 414 that are serially coupled between a ground voltage terminal (or a ground) and the output node OUT1 of the first inverter 211_2. The clock ICK may be inputted into a gate of the first PMOS transistor 411, and the inverted clock IBCK may be inputted into a gate of the second NMOS transistor 414. The gates of the second PMOS transistor 412 and the first NMOS transistor 413 may be coupled to an input node IN1 of the first inverter 211_2. When the clock ICK is in a logic low level, the first PMOS transistor 411 and the second NMOS transistor 414 are turned on to enable the first inverter 211_2 and thereby invert a signal at the input node IN1 and output the inverted signal at the output node OUT1. When the clock ICK is in a logic high level, the first PMOS transistor 411 and the second NMOS transistor 414 are turned off to disable the first inverter 211_2.

The second inverter 221_2 may include third and fourth PMOS transistors 421 and 422 that are serially coupled between the power source voltage terminal VDD and an output node OUT2 of the second inverter 221_2, and third and fourth NMOS transistors 423 and 424 that are serially coupled between the ground voltage terminal and the output node OUT2 of the second inverter 221_2. The inverted clock IBCK may be inputted into a gate of the third PMOS transistor 421, and the clock ICK may be inputted into a gate of the fourth NMOS transistor 424. The gates of the fourth PMOS transistor 422 and the third NMOS transistor 423 may be coupled to an input node IN2 of the second inverter 221_2. When the clock ICK is in a logic high level, the third PMOS transistor 421 and the fourth NMOS transistor 424 are turned on to enable the second inverter 221_2 and thereby invert a signal at the input node IN2 and output the inverted signal at the output node OUT2. When the clock ICK is in a logic low level, the third PMOS transistor 421 and the fourth NMOS transistor 424 are turned off to disable the second inverter 221_2.

Figure 5:
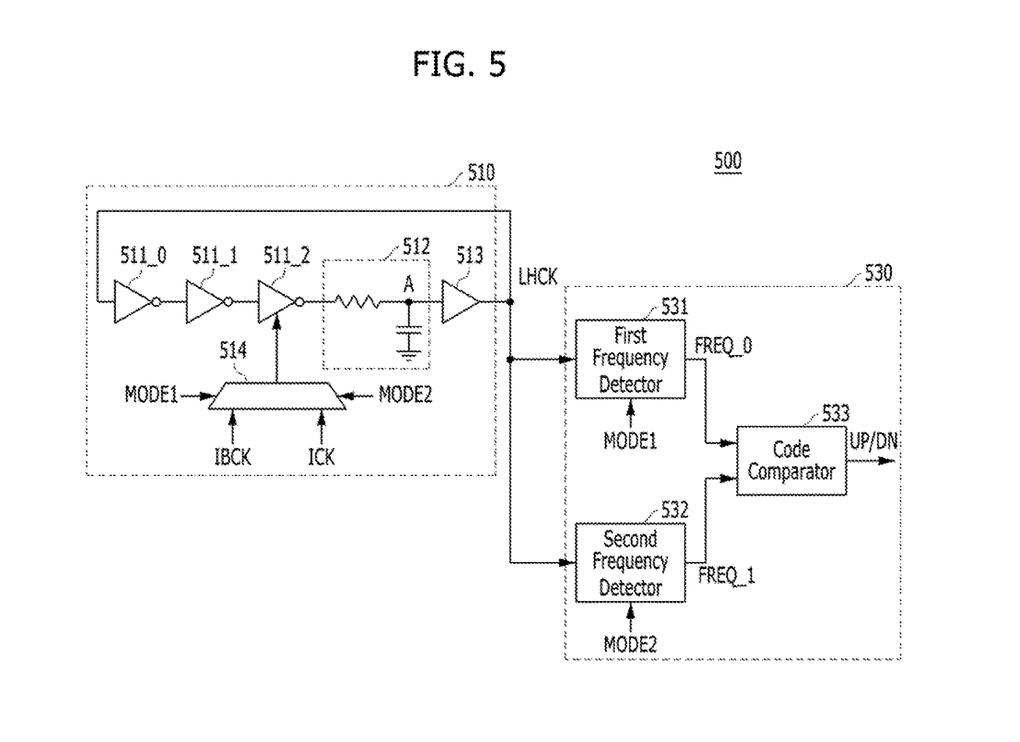
FIG. 5 is a block diagram illustrating a duty cycle detector 500 in accordance with another embodiment of the present disclosure.

FIG. 5 is a block diagram illustrating a duty cycle detector 500 in accordance with another embodiment of the present disclosure.

Referring to FIG. 5, the duty cycle detector 500 may include a ring oscillator 510 and a frequency comparator 530.

The ring oscillator 510 may generate a periodic wave (or a periodic signal) LHCK having a frequency which is in proportion to a low pulse width of the clock ICK, that is, a high pulse width of the inverted clock IBCK in a first mode, and generate a periodic wave LHCK having a frequency which is in proportion to a high pulse width of the clock ICK in a second mode. The ring oscillator 510 may operate in the substantially same manner as the first ring oscillator 210 of FIG. 2 in the first mode and operate in the substantially same manner as the second ring oscillator 220 of FIG. 2 in the second mode.

The ring oscillator 510 may include an odd number 2N−1 of inverters, for example, three inverters 511_0 to 511_2 (where N is an integer equal to or greater than '1'), a low-pass filter (LPF) 512, a Schmitt trigger circuit 513, and a selector 514.

The inverters 511_0 to 511_2 may be coupled in a form of a ring to be used for generation of the periodic wave LHCK. An inverter 511_2 among the inverters 511_0 to 511_2 may be enabled in a section where an output signal of the selector 514 is in a logic high level, and disabled in a section where an output signal of the selector 514 is in a logic low level. The selector 514 may select and output the inverted clock IBCK when a first mode signal MODE1 is enabled, and the selector 514 may select and output the clock ICK when a second mode signal MODE2 is enabled. Therefore, the inverter 511_2 may be enabled in the section where the clock ICK is in a logic low level in the first mode, and the inverter 511_2 may be enabled in the section where the clock ICK is in a logic high level in the second mode. Herein, although FIG. 5 shows an example where the inverter 511_2 among the inverters 511_0 to 511_2 is enabled in response to the output of the selector 514, embodiments of the present disclosure are not limited thereto. In an embodiment, the remaining inverters 511_0 and 511_1 may be enabled in response to the output of the selector 514.

A first end (e.g., a front end) of the low-pass filter 512 may be coupled to an output terminal of the inverter 511_2. A node A at a second end (e.g., a rear end) of the low-pass filter 512 may have a voltage that is gradually changed due to a filtering operation of the low-pass filter 512. The low-pass filter 512 may include a resistor and a capacitor.

The Schmitt trigger circuit 513 may be coupled to the node A at the rear end of the low-pass filter 512. The Schmitt trigger circuit 513 transitions its output signal into a logic high level when the voltage at the node A is higher than a first given value, which is equal to a reference value plus an offset value α (i.e., the reference value+the offset value α). The Schmitt trigger circuit 513 transitions its output signal into a logic low level when the voltage at the node A is lower than a second given value, which is equal to the reference value minus the offset value α (i.e., the reference value−the offset value α). Herein, the reference value may be a reference value for determining logic levels of signals output from general devices, such as the inverters 511_0 to 511_2, between a logic high level and a logic low level.

The low-pass filter 512 and the Schmitt trigger circuit 513 are used to accumulate the influence of the output of the selector 514 on the frequency of the periodic wave LHCK. In another embodiment, the low-pass filter 512 and the Schmitt trigger circuit 513 may be omitted from the ring oscillator 510.

The frequency comparator 530 may compare the frequency of the periodic wave LHCK generated in the first mode with the frequency of the periodic wave LHCK generated in the second mode and generate a duty cycle detection signal UP/DN indicating a duty cycle ratio of the clock ICK. When the frequency of the periodic wave LHCK generated in the first mode is higher than the frequency of the periodic wave LHCK generated in the second mode, that is, when a low pulse width of the clock ICK is longer than a high pulse width of the clock ICK, the frequency comparator 530 may produce the duty cycle detection signal UP/DN of a first value (e.g., a logic high level). Also, when the frequency of the periodic wave LHCK generated in the first mode is lower than the frequency of the periodic wave LHCK generated in the second mode, that is, when a high pulse width of the clock ICK is longer than a low pulse width of the clock ICK, the frequency comparator 530 may produce the duty cycle detection result UP/DN of a second value (e.g., a logic low level).

The frequency comparator 530 may include a first frequency detector 531, a second frequency detector 532, and a code comparator 533. The first frequency detector 531 may detect the frequency of the periodic wave LHCK in the first mode where the first mode signal MODE1 is enabled and generate a first frequency code FREQ_0. The second frequency detector 532 may detect the frequency of the periodic wave LHCK in the second mode where the second mode signal MODE2 is enabled and generate a second frequency code FREQ_1. The code comparator 533 may compare the first frequency code FREQ_0 and the second frequency code FREQ_1 with each other and generate the duty cycle detection signal UP/DN. The duty cycle detection signal UP/DN may be transferred to a duty cycle correction circuit (not shown) of diverse forms and used to correct the duty cycle of the clock ICK.

Figure 6:
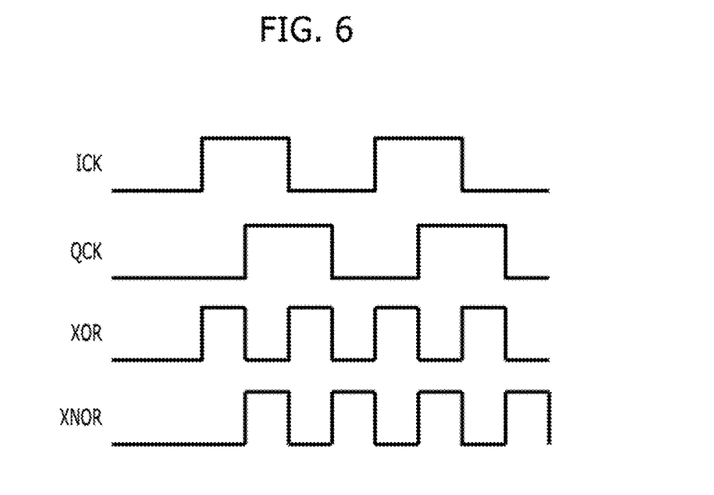
FIG. 6 illustrates a first clock ICK, a second clock QCK, and signals XOR and XNOR respectively obtained by performing an XOR operation and an XNOR operation on the first clock ICK and the second clock QCK.

FIG. 6 illustrates a first clock ICK, a second clock QCK, and signals XOR and XNOR that are respectively obtained by performing an XOR operation and an XNOR operation on the first clock ICK and the second clock QCK.

The first clock ICK and the second clock QCK are clocks having a phase difference of approximately 90° from each other. It may be determined whether the phase difference between the first clock ICK and the second clock QCK is greater than approximately 90° or not by comparing a high pulse width (or an on-time duration) of a signal XOR obtained by performing an XOR operation on the first clock ICK and the second clock QCK with a high pulse width (or an on-time duration) of a signal XNOR obtained by performing an XNOR operation on the first clock ICK and the second clock QCK.

When the phase difference between the first clock ICK and the second clock QCK is substantially smaller than 90°, the high pulse width of the signal XNOR may be longer than the high pulse width of the signal XOR as shown in FIG. 6. Conversely, when the phase difference between the first clock ICK and the second clock QCK is substantially greater than 90°, the high pulse width of the signal XOR may be longer than the high pulse width of the signal XNOR differently from FIG. 6 When this principle is applied to the duty detection circuit 200 shown in FIG. 2, a phase difference detector for detecting whether the phase difference between the first clock ICK and the second clock QCK is substantially greater than or smaller than 90° may be implemented.

Figure 7:
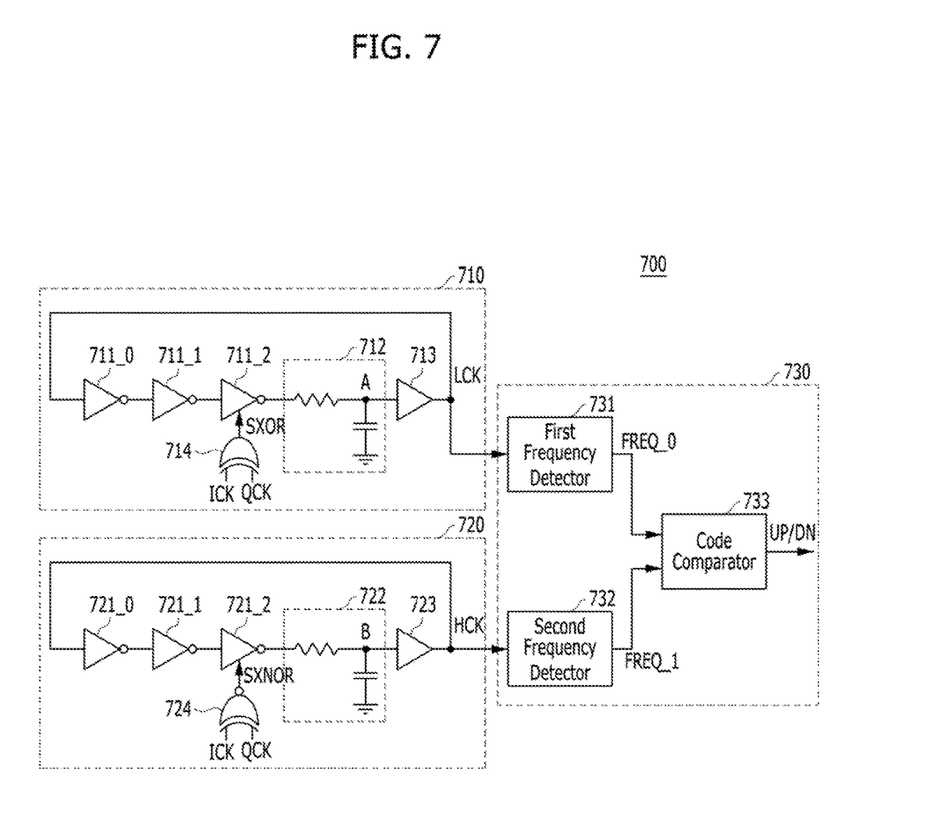
FIG. 7 is a block diagram illustrating a phase difference detector 700 in accordance with an embodiment of the present disclosure.

FIG. 7 is a block diagram illustrating a phase difference detector 700 in accordance with an embodiment of the present disclosure. The phase difference detector 700 may detect whether a phase difference between a first clock ICK and a second clock QCK is substantially greater than or smaller than 90°.

Referring to FIG. 7, the phase difference detector 700 may include a first ring oscillator 710, a second ring oscillator 720, and a frequency comparator 730.

The first ring oscillator 710 may generate a first periodic wave (or a first periodic signal) LCK having a frequency which is in proportion to a length of a section where the first clock ICK and the second clock QCK have different values. In an embodiment, the first periodic wave LCK has a frequency that is proportional to an on-time duration of a signal SXOR when the first clock ICK has a different logic value from that of the second clock QCK. The first ring oscillator 710 may include an odd number 2N−1 of first inverters 711_0 to 711_2 (where N is an integer equal to or greater than '1'), a first low-pass filter (LPF) 712, and a first Schmitt trigger circuit 713, and an XOR gate 714.

The first inverters 711_0 to 711_2 may be coupled in a form of a ring to be used for generation of the first periodic wave LCK. An inverter 711_2 among the first inverters 711_0 to 711_2 may be enabled in a section where the output signal SXOR of the XOR gate 714 has a first value (e.g., a logic high level). Because the output signal SXOR of the XOR gate 714 is in a logic high level in a section where the first clock ICK and the second clock QCK are of different levels, the length of the section where the first clock ICK and the second clock QCK are of different levels may affect the frequency of the first periodic wave LCK generated in the first ring oscillator 710. Herein, although FIG. 7 shows an example where the inverter 711_2 among the first inverters 711_0 to 711_2 is enabled in response to the output signal SXOR of the XOR gate 714, embodiments of the present disclosure are not limited thereto. In an embodiment, the remaining first inverters 711_0 and 711_1 may be enabled in response to the output signal SXOR of the XOR gate 714. The inverter 711_2 may have substantially the same configuration as the first inverter 211_2 shown in FIG. 4.

A first end (e.g., a front end) of the first low-pass filter 712 may be coupled to an output terminal of the inverter 711_2. A node A at a second end (e.g., the rear end) of the first low-pass filter 712 may be gradually changed due to a filtering operation of the first low-pass filter 712. The first low-pass filter 712 may include a resistor and a capacitor.

The first Schmitt trigger circuit 713 may be coupled to the node A at the rear end of the first low-pass filter 712. The first Schmitt trigger circuit 713 transitions its output signal into a logic high level when the voltage at the node A is higher than a first given value, which is equal to a reference value plus an offset value α (i.e., the reference value+the offset value α). The first Schmitt trigger circuit 713 transitions its output signal into a logic low level when the voltage at the node A is lower than a second given value, which is equal to the reference value minus the offset value α (i.e., the reference value−the offset value α). Herein, the reference value may be a reference value for determining logic levels of signals output from general devices, such as the first inverters 711_0 to 711_2, between a logic high level and a logic low level.

The first low-pass filter 712 and the first Schmitt trigger circuit 713 are used to accumulate the influence of the length of a section where the output signal SXOR of the XOR gate 714 is in a logic high level on the frequency of the first periodic wave LCK. In another embodiment, the first low-pass filter 712 and the first Schmitt trigger circuit 713 may be omitted from the first ring oscillator 710.

The second ring oscillator 720 may generate a second periodic wave (or a second periodic signal) HCK having a frequency which is in proportion to a length of the section where the first clock ICK and the second clock QCK are in the same level. In an embodiment, the second periodic wave HCK has a frequency that is proportional to an on-time duration of an output signal SXNOR when the first clock ICK has the same logic value as that of the second clock QCK. The second ring oscillator 720 may include an odd number 2N−1 of second inverters, for example, three second inverters 721_0 to 721_2 (where N is an integer equal to or greater than '1'), a second low-pass filter 722, and a second Schmitt trigger circuit 723, and an XNOR gate 724.

The second inverters 721_0 to 721_2 may be coupled in a form of a ring to be used for generation of the second periodic wave HCK. An inverter 721_2 among the second inverters 721_0 to 721_2 may be enabled in a section where the output signal SXNOR of the XNOR gate 724 is in a logic high level. Since the output signal SXNOR of the XNOR gate 724 is in a logic high level in the section where the first clock ICK and the second clock QCK are in the same level, the length of the section where the first clock ICK and the second clock QCK are in the same level may affect the frequency of the second periodic wave HCK which is generated in the second ring oscillator 720. Herein, although FIG. 7 shows an example where the inverter 721_2 among the second inverters 721_0 to 721_2 is enabled in response to the output signal SXNOR of the XNOR gate 724, embodiments of the present disclosure are not limited thereto. In an embodiment, the remaining second inverters 721_0 and 721_1 may be enabled in response to the output signal SXNOR of the XNOR gate 724. The inverter 721_2 may have substantially the same configuration as the second inverter 221_2 shown in FIG. 4.

A first end (e.g., a front end) of the second low-pass filter 722 may be coupled to an output terminal of the inverter 721_2. A node B at a second end (e.g., a rear end) of the second low-pass filter 722 may be gradually changed due to a filtering operation of the second low-pass filter 722. The second low-pass filter 722 may include a resistor and a capacitor.

The second Schmitt trigger circuit 723 may be coupled to the node B at the rear end of the second low-pass filter 722. The second Schmitt trigger circuit 723 transitions its output signal into a logic high level when the voltage at the node B is higher than a first given value, which is equal to a reference value plus an offset value α (i.e., the reference value+the offset value α). The second Schmitt trigger circuit 723 transitions its output signal into a logic low level when the voltage at the node B is lower than a second given value, which is equal to the reference value minus the offset value α (i.e., the reference value−the offset value α). Herein, the reference value may be a reference value for determining logic levels of signals output from general devices, such as the second inverters 721_0 to 721_2, between a logic high level and a logic low level.

When the first low-pass filter 712 and the first Schmitt trigger circuit 713 are omitted from the first ring oscillator 710, the second low-pass filter 722 and the second Schmitt trigger circuit 723 may be omitted from the second ring oscillator 720.

The frequency comparator 730 may compare the frequency of the first periodic wave LCK generated by the first ring oscillator 710 with the frequency of the second periodic wave HCK generated by the second ring oscillator 720 and generate a phase difference detection signal UP/DN representing a phase difference between the first clock ICK and the second clock QCK is substantially greater than or smaller than 90°. When the frequency of the first periodic wave LCK is higher than the frequency of the second periodic wave HCK, that is, when a phase difference between the first clock ICK and the second clock QCK is substantially greater than 90°, the frequency comparator 730 may produce the phase difference detection signal UP/DN of a logic high level. Also, when the frequency of the first periodic wave LCK is lower than the frequency of the second periodic wave HCK, that is, when a phase difference between the first clock ICK and the second clock QCK is substantially smaller than 90°, and the frequency comparator 730 may produce the phase difference detection signal UP/DN of a logic low level.

The frequency comparator 730 may include a first frequency detector 731, a second frequency detector 732, and a code comparator 733. The first frequency detector 731 may detect the frequency of the first periodic wave LCK and generate a first frequency code FREQ_0 which represents the detected frequency of the first periodic wave LCK. The second frequency detector 732 may detect the frequency of the second periodic wave HCK and generate a second frequency code FREQ_1 which represents the detected frequency of the second periodic wave HCK. The code comparator 733 may compare the first frequency code FREQ_0 and the second frequency code FREQ_1 with each other and generate the phase difference detection signal UP/DN. The phase difference detection signal UP/DN may be transferred to a phase difference correction circuit (not shown) and used to correct the relative phase difference (e.g., a delay value of the second clock QCK with respect to the first clock ICK) of the first clock ICK and the second clock QCK.

Figure 8:
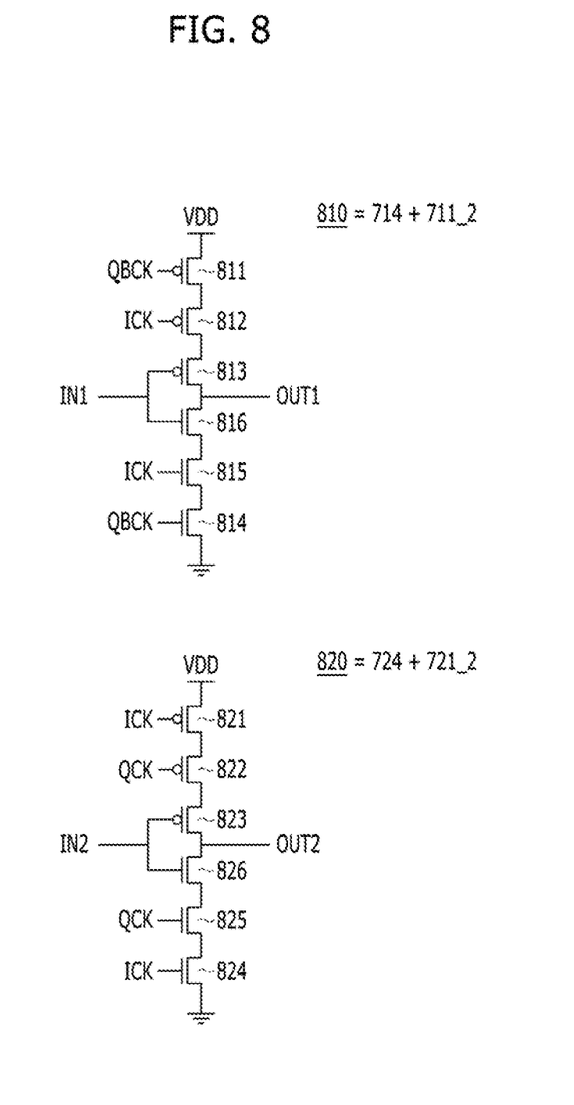
FIG. 8 is a schematic diagram illustrating a first inverter 810 and a second inverter 820 that respectively include a first inverter 711_2 and a second inverter 721_2 shown in FIG. 7, in accordance with an embodiment of the present disclosure.

FIG. 8 is a schematic diagram illustrating a first inverter 810 and a second inverter 820 that respectively include a first inverter 711_2 and a second inverter 721_2 shown in FIG. 7, in accordance with another embodiment of the present disclosure. Because the first inverter 810 illustrated in FIG. 8 performs the functions of the XOR gate 714 and the first inverter 711_2 shown in FIG. 7, the XOR gate 714 is not separately implemented. Because the second inverter 820 illustrated in FIG. 8 performs the functions of the XNOR gate 724 and the second inverter 721_2 shown in FIG. 7, the XNOR gate 724 is not separately implemented.

Referring to FIG. 8, the first inverter 810 may include first to third PMOS transistors 811 and 813 that are serially coupled between a power source voltage terminal (or a power supply voltage) VDD and an output node OUT1 of the first inverter 810, and first to third NMOS transistors 814 to 816 that are serially coupled between a ground voltage terminal (or a ground) and the output node OUT1 of the first inverter 810. A first PMOS transistor 811 may be turned on or off in response to an inverted version QBCK of a second clock QCK. A second PMOS transistor 812 may be turned on or off in response to the first clock ICK. A third PMOS transistor 813 may be turned on or off in response to an input signal IN1 of the first inverter 810. The first NMOS transistor 814 may be turned on or off in response to an inverted version QBCK of the second clock QCK. The second NMOS transistor 815 may be turned on or off in response to the first clock ICK. The third NMOS transistor 816 may be turned on or off in response to the input signal IN1 of the first inverter 810. For example, when the first clock ICK and the second clock QCK have a logic high level and a logic low level, respectively, the first NMOS transistor 814 and the second NMOS transistor 815 may be turned on to enable the pull-down driving of the first inverter 810. While the first clock ICK and the second clock QCK have a logic low level and a logic high level, respectively, the first PMOS transistor 811 and the second PMOS transistor 812 may be turned on to enable the pull-up driving of the first inverter 810. As a result, the first inverter 810 may be enabled in a section where the first clock ICK and the second clock QCK have different logic levels.

The second inverter 820 may include fourth to sixth PMOS transistors 821 and 823 that are serially coupled between the power source voltage terminal VDD and an output node OUT2 of the second inverter 820, and fourth to sixth NMOS transistors 824 to 826 that are serially coupled between the ground voltage terminal and the output node OUT2 of the second inverter 820. The fourth PMOS transistor 821 may be turned on or off in response to the first clock ICK. The fifth PMOS transistor 822 may be turned on or off in response to the second clock QCK. The sixth PMOS transistor 823 may be turned on or off in response to an input signal IN2 of the second inverter 820. The fourth NMOS transistor 824 may be turned on or off in response to the first clock ICK. The fifth NMOS transistor 825 may be turned on or off in response to the second clock QCK. The sixth NMOS transistor 826 may be turned on or off in response to the input signal IN2 of the second inverter 820. When the first clock ICK and the second clock QCK have the same logic high level of, the fourth NMOS transistor 824 and the fifth NMOS transistor 825 may be turned on to enable the pull-down driving of the second inverter 820. When the first clock ICK and the second clock QCK have the same logic low level, the fourth PMOS transistor 821 and the fifth PMOS transistor 822 may be turned on to enable the pull-up driving of the second inverter 820. As a result, the second inverter 820 may be enabled in a section where the first clock ICK and the second clock QCK have the same logic level.

Figure 9:
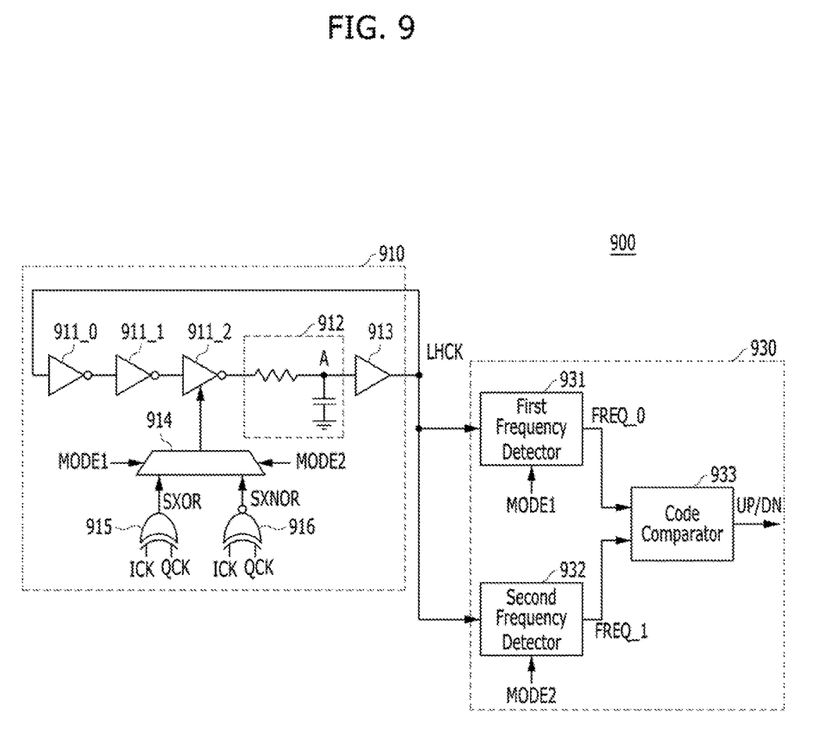
FIG. 9 is a block diagram illustrating a phase difference detector 900 in accordance with another embodiment of the present disclosure.

FIG. 9 is a block diagram illustrating a phase difference detector 900 in accordance with another embodiment of the present disclosure.

Referring to FIG. 9, the phase difference detector 900 may include a ring oscillator 910 and a frequency comparator 930.

The ring oscillator 910 may generate a periodic wave (or a periodic signal) LHCK having a frequency which is in proportion to a length of a section where the first clock ICK and the second clock QCK have different logic levels from each other in a first mode, generate a periodic wave LHCK having a frequency which is in proportion to a length of a section where the logic level of the first clock ICK and the logic level of the second clock QCK are the same in a second mode. In other words, the ring oscillator 910 may operate in the substantially same manner as the first ring oscillator 710 of FIG. 7 in the first mode and operate in the substantially same manner as the second ring oscillator 720 of FIG. 7 in the second mode.

The ring oscillator 910 may include an odd number 2N−1 of inverters, for example, three inverters 911_0 to 911_2 (where N is an integer equal to or greater than '1'), a low-pass filter 912, a Schmitt trigger circuit 913, a selector 914, an XOR gate 915, and an XNOR gate 916.

The inverters 911_0 to 911_2 may be coupled in a form of a ring to be used for generation of the periodic wave LHCK. An inverter 911_2 among the inverters 911_0 to 911_2 may be enabled in a section where an output signal of the selector 914 is in a logic high level. The selector 914 may select and output an output signal SXOR of the XOR gate 915 into which the first clock ICK and the second clock QCK are inputted when a first mode signal MODE1 is enabled, and the selector 914 may select and output an output signal SXNOR of the XNOR gate 916 into which the first clock ICK and the second clock QCK are inputted when a second mode signal MODE2 is enabled. Therefore, the inverter 911_2 may be enabled in a section where a logic level of the first clock ICK and a logic level of the second clock QCK are different from each other in the first mode, and the inverter 911_2 may be enabled in a section where the logic level of the first clock ICK and the logic level of the second clock QCK are the same in the second mode. Herein, although FIG. 9 shows an example where the inverter 911_2 among the inverters 911_0 to 911_2 is enabled in response to the output signal of the selector 914, embodiments of the present disclosure are not limited thereto. In an embodiment, the remaining inverters 911_0 and 911_1 may be enabled in response to the output signal of the selector 914.

A first end (e.g., a front end of) the low-pass filter 912 may be coupled to an output terminal of the inverter 911_2. A node A at a second end (e.g., a rear end) of the low-pass filter 912 may be gradually changed due to a filtering operation of the low-pass filter 912. The low-pass filter 912 may include a resistor and a capacitor.

The Schmitt trigger circuit 913 may be coupled to the node A at the rear end of the low-pass filter 912. The Schmitt trigger circuit 913 transitions its output signal into a logic high level when the voltage at the node A is higher than a first given value, which is equal to a reference value plus α (i.e., the reference value+the offset value α). The Schmitt trigger circuit 913 transitions its output signal into a logic low level when the voltage at the node A is lower than a second given value, which is equal to the reference value minus the offset value α (the reference value−the offset value α). Herein, the reference value may be a reference value for determining logic levels of signals output from general devices, such as the inverters 911_0 to 911_2, between a logic high level and a logic low level.

The low-pass filter 912 and the Schmitt trigger circuit 913 are used to accumulate the influence of the output of the selector 914 on the frequency of the periodic wave LHCK. The low-pass filter 912 and the Schmitt trigger circuit 913 may be omitted from the ring oscillator 910.

The frequency comparator 930 may compare the frequency of the periodic wave LHCK generated in the first mode with the frequency of the periodic wave LHCK generated in the second mode and generate a phase difference detection signal UP/DN representing whether the phase difference between the first clock ICK and the second clock QCK is substantially greater than or smaller than 90°. When the frequency of the periodic wave LHCK generated in the first mode is higher than the frequency of the periodic wave LHCK generated in the second mode, that is, when the phase difference between the first clock ICK and the second clock QCK is substantially greater than 90°, the frequency comparator 930 may produce the phase difference detection signal UP/DN of a logic high level. Also, when the frequency of the periodic wave LHCK generated in the first mode is lower than the frequency of the periodic wave LHCK generated in the second mode, that is, when the phase difference between the first clock ICK and the second clock QCK is substantially smaller than 90°, the frequency comparator 930 may produce the phase difference detection signal UP/DN of a logic low level.

The frequency comparator 930 may include a first frequency detector 931, a second frequency detector 932, and a code comparator 933. The first frequency detector 931 may detect the frequency of the periodic wave LHCK in the first mode where the first mode signal MODE1 is enabled and generate the first frequency code FREQ_0. The second frequency detector 932 may detect the frequency of the periodic wave LHCK in the second mode where the second mode signal MODE2 is enabled and generate the second frequency code FREQ_1. The code comparator 933 may compare the first frequency code FREQ_0 and the second frequency code FREQ_1 with each other and generate the phase difference detection signal UP/DN. The phase difference detection signal UP/DN may be transferred to a phase difference correction circuit (not shown) and used to correct the relative phase difference (e.g., a delay value of the second clock QCK with respect to the first clock ICK) of the first clock ICK and the second clock QCK.

According to the embodiments of the present disclosure, it is possible to accurately detect a duty cycle ratio of a clock and accurately detect a phase difference between clocks.

While the present disclosure has been described with respect to the specific embodiments, it will be apparent to those skilled in the art that various changes and modifications may be made without departing from the spirit and scope of the invention as defined in the following claims.

What is claimed is:

1. A duty cycle detector comprising:
  a first ring oscillator including an odd number of first inverters and suitable for generating a first periodic signal using the first inverters, wherein at least one inverter among the first inverters is enabled during a time interval when a clock has a first value;
  a second ring oscillator including an odd number of second inverters and suitable for generating a second periodic signal using the second inverters, wherein at least one inverter among the second inverters is enabled during a time interval when the clock has a second value; and a frequency comparator suitable for comparing a frequency of the first periodic signal with a frequency of the second periodic signal and generating a duty cycle detection signal of the clock.

2. The duty cycle detector of claim 1, wherein the first value is a logic high level and the second value is a logic low level, the at least one inverter among the first inverters including a third inverter, the at least one inverter among the second inverters including a fourth inverter, wherein the first ring oscillator further includes a first low-pass filter (LPF) having a first end which is coupled to an output of the third inverter, and wherein the second ring oscillator further includes a second LPF having a first end which is coupled to an output of the fourth inverter.

3. The duty cycle detector of claim 2, wherein the first ring oscillator further includes a first Schmitt trigger circuit which is coupled to a second end of the first LPF, and wherein the second ring oscillator further includes a second Schmitt trigger circuit which is coupled to a second end of the second LPF.

4. A duty cycle detector comprising:

a ring oscillator including an odd number of inverters and suitable for generating a periodic signal using the inverters, wherein at least one inverter among the inverters is enabled during a first time interval when a clock has a first value in a first mode and enabled during a second time interval when the clock has a second value in a second mode; and a frequency comparator suitable for comparing a frequency of the periodic signal generated in the first mode with a frequency of the periodic signal generated in the second mode and generating a duty cycle detection signal of the clock.

5. The duty cycle detector of claim 4, wherein the first value is a logic low level and the second value is a logic high level, the at least one inverter among the inverters including a first inverter, and wherein the ring oscillator further includes a low-pass filter (LPF) having a first end which is coupled to an output of the first inverter.

6. The duty cycle detector of claim 5, wherein the ring oscillator further includes a Schmitt trigger circuit which is coupled to a second end of the LPF.

7. A phase difference detector comprising:

a first ring oscillator including an odd number of first inverters and suitable for generating a first periodic signal using the first inverters, wherein at least one inverter among the first inverters is enabled during a first time interval when a first clock and a second clock have different logic values;

a second ring oscillator including an odd number of second inverters and suitable for generating a second periodic signal using the second inverters, wherein at least one inverter among the second inverters is enabled during a second time interval when the first clock and the second clock have a common logic value; and a frequency comparator suitable for comparing a frequency of the first periodic signal with a frequency of the second periodic signal and generating a phase difference detection signal indicative of a phase difference between the first clock and the second clock.

8. The phase difference detector of claim 7, wherein the at least one inverter among the first inverters including a third inverter, the at least one inverter among the second inverters including a fourth inverter, wherein the first ring oscillator further includes a first low-pass filter (LPF) having a first end which is coupled to an output of the third inverter, and wherein the second ring oscillator further includes a second LPF having a first end which is coupled to an output of the fourth inverter.

9. The phase difference detector of claim 8, wherein the first ring oscillator further includes a first Schmitt trigger circuit which is coupled to a second end of the first LPF, and wherein the second ring oscillator further includes a second Schmitt trigger circuit which is coupled to a second end of the second LPF.

10. The phase difference detector of claim 9, wherein the first ring oscillator further includes an XOR gate receiving the first clock and the second clock and providing an output signal to the third inverter, the third inverter being enabled in response to the output signal of the XOR gate, and wherein the second ring oscillator further includes an XNOR gate receiving the first clock and the second clock and providing an output signal to the fourth inverter, the fourth inverter being enabled in response to the output signal of the XNOR gate.

11. The phase difference detector of claim 7, wherein the at least one inverter among the first inverters including a third inverter, the third inverter including:

first, second, and third PMOS transistors that are serially coupled between a power source voltage terminal and a first node; and first, second, and third NMOS transistors that are serially coupled between a ground voltage terminal and the first node, wherein the first PMOS transistor is turned on or off in response to an inverted version of the second clock, and the second PMOS transistor is turned on or off in response to the first clock, and the third PMOS transistor is turned on or off in response to an input signal of the third inverter, and wherein the first NMOS transistor is turned on or off in response to the inverted version of the second clock, and the second NMOS transistor is turned on or off in response to the first clock, and the third NMOS transistor is turned on or off in response to the input signal of the third inverter.

12. The phase difference detector of claim 11, wherein the at least one inverter among the second inverters includes a fourth inverter, the fourth inverter including:

fourth, fifth, and sixth PMOS transistors that are serially coupled between the power source voltage terminal and a second node; and fourth, fifth, and sixth NMOS transistors that are serially coupled between the ground voltage terminal and the second node, wherein the fourth PMOS transistor is turned on or off in response to the first clock, and the fifth PMOS transistor is turned on or off in response to the second clock, and the sixth PMOS transistor is turned on or off in response to an input signal o12f the fourth inverter, and wherein the fourth NMOS transistor is turned on or off in response to the first clock, and the fifth NMOS transistor is turned on or off in response to the second clock, and the sixth NMOS transistor is turned on or off in response to the input signal of the fourth inverter.

13. A phase difference detector comprising:

a ring oscillator suitable for including an odd number of inverters and generating a periodic signal using the inverters, wherein at least one inverter among the inverters is enabled during a first time interval when a first clock and a second clock have different logic values in a first mode and enabled in a second time interval when the first clock and the second clock have a common logic value in a second mode; and a frequency comparator suitable for comparing a frequency of the periodic signal generated in the first mode with a frequency of the periodic signal generated in the second mode and generating a phase difference detection signal between the first clock and the second clock.

14. The phase difference detector of claim 13, wherein the ring oscillator further includes a low-pass filter (LPF) having a first end which is coupled to the at least one inverter.

15. The phase difference detector of claim 14, wherein the ring oscillator further includes a Schmitt trigger circuit which is coupled to a second end of the LPF.

16. The phase difference detector of claim 13, further comprising:
   an XOR gate receiving the first clock and the second clock and generating a first output signal;
   a XNOR gate receiving the first clock and the second clock and generating a second output signal; and
   a selector receiving the first output signal, the second output signal, a first mode signal, and a second mode signal and selecting one of the first and second output signals in response to the first and second mode signals.

17. The phase difference detector of claim 16, wherein the selector provides the selected one of the first and second output signals to the at least one inverter.

* * * * *